(12) United States Patent
Li et al.

(10) Patent No.: US 10,165,674 B1
(45) Date of Patent: Dec. 25, 2018

(54) CIRCUIT BOARD AND ELECTROMAGNETIC BANDGAP STRUCTURE THEREOF

(71) Applicants: INVENTEC (PUDONG) TECHNOLOGY CORPORATION, Shanghai (CN); INVENTEC CORPORATION, Taipei (TW)

(72) Inventors: Chih-Cheng Li, Taipei (TW); Yung-Chin Hsieh, Taipei (TW)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 0 days.

(21) Appl. No.: 15/862,542

(22) Filed: Jan. 4, 2018

(30) Foreign Application Priority Data

Nov. 10, 2017 (CN) .......................... 2017 1 1102919

(51) Int. Cl.
| | |
|---|---|
| *H05K 1/02* | (2006.01) |
| *H01Q 15/00* | (2006.01) |
| *H01P 1/20* | (2006.01) |
| *H05K 3/46* | (2006.01) |

(52) U.S. Cl.
CPC .......... *H05K 1/0236* (2013.01); *H01P 1/2005* (2013.01); *H01Q 15/006* (2013.01); *H01L 2224/16225* (2013.01); *H05K 1/0237* (2013.01); *H05K 3/4602* (2013.01); *H05K 3/4611* (2013.01); *H05K 3/4652* (2013.01); *H05K 2201/09309* (2013.01)

(58) Field of Classification Search
CPC ... H05K 1/0236; H01P 1/2005; H01Q 15/006
See application file for complete search history.

(56) References Cited

U.S. PATENT DOCUMENTS

| | | | | |
|---|---|---|---|---|
| 2003/0071763 A1* | 4/2003 | McKinzie, III | ...... | H01Q 9/0421 343/909 |
| 2016/0006093 A1* | 1/2016 | Tseng | ..................... | H01Q 1/243 343/850 |

* cited by examiner

*Primary Examiner* — Hoa C Nguyen
(74) *Attorney, Agent, or Firm* — Maschoff Brennan (57) ABSTRACT

A circuit board includes a dielectric layer, a conductive layer disposed on a surface of the dielectric layer, and an electromagnetic bandgap (EBG) structure disposed in the dielectric layer. The electromagnetic bandgap structure includes a via and a signal suppression board. Two opposite ends of the via are respectively connected to the electrically conductive layer and the signal suppression board respectively. The signal suppression board has at least one hollow pattern.

9 Claims, 7 Drawing Sheets

CIRCUIT BOARD AND ELECTROMAGNETIC BANDGAP STRUCTURE THEREOF

This non-provisional application claims priority under 35 U.S.C. § 119(a) on Patent Application No(s). 201711102919.1 filed in China on Nov. 10, 2017, the entire contents of which are hereby incorporated by reference.

BACKGROUND OF THE INVENTION

Technical Field of the Invention

The disclosure relates to an electromagnetic bandgap structure (EBG) and a circuit board, more particularly to an electromagnetic bandgap structure capable of suppressing dual-band signals and a circuit board having the electromagnetic bandgap structure.

Description of the Related Art

Circuit boards and the like become more and more complicated, signals in multiple bands are transmitted therein, which makes cross-coupling between power and signals more frequent and unavoidable. In general, there are microstrips to maintain the integrity of signal. In addition, the power plan of the circuit board due to its own function without additional protection, and it has a current rating limit, so a large area of the power plan is unavoidable. If the power plan passes through the signal line, the signals in the signal line would be coupled into the power plan and radiated into the air through the large area power plan, causing self-interference and affecting the wireless receiving performance.

SUMMARY

One embodiment of the disclosure provides a circuit board which comprises a dielectric layer, a conductive layer and an electromagnetic bandgap structure. The conductive layer is disposed on a surface of the dielectric layer; and the electromagnetic bandgap structure is disposed inside the dielectric layer. The electromagnetic bandgap structure includes a via and a signal suppression board. The two opposite ends of the via respectively connects to the conductive layer and the signal suppression board, and the signal suppression board has at least one hollow pattern.

One embodiment of the disclosure provides an electromagnetic bandgap structure of the present disclosure comprises a via and a signal suppression board. The signal suppression board is connected to the via, and the signal suppression board has two hollow patterns arranged point-symmetrically to the via. Each of the two hollow patterns has a first L-shaped channel and a second L-shaped channel. The first L-shaped channel has a first extension portion and a second extension portion connected to each other. The second L-shaped channel has a third extension portion and a forth extension portion connected to each other. The first extension portion and the third extension portion are respectively located at two opposite sides of the via, and the second extension portion and the forth extension portion are respectively located at another two opposite sides of the via. The second extension portion is connected to the third extension portion, and an end of the first extension portion away from the second extension portion is separated apart from the forth extension portion.

One embodiment of the disclosure provides an electromagnetic bandgap structure which comprise a via and a signal suppression board. The signal suppression board is connected to the via, and the signal suppression board has two first hollow patterns and two second hollow patterns. The two first hollow patterns are arranged point-symmetrically to the via, and the two second hollow patterns are arranged point-symmetrically to the via. The two first hollow patterns and the two second hollow patterns are staggered around the via. Each of the two first hollow patterns has a first L-shaped channel and a square-shaped spiral channel connected to each other, and the two first L-shaped channels are respectively located at two opposite sides of the via. Each of the two second hollow patterns has a second L-shaped channel and a comb-shaped channel connected to each other, and the two second L-shaped channels are respectively located at another two opposite sides of the via.

BRIEF DESCRIPTION OF THE DRAWINGS

The present disclosure will become better understood from the detailed description given hereinbelow and the accompanying drawings which are given by way of illustration only and thus are not intending to limit the present disclosure and wherein.

DETAILED DESCRIPTION

In the following, the detailed features and advantages of the present disclosure are described in detail in the embodiments, and the content thereof is sufficient for person skilled in the art to understand and implement the technical contents of the present disclosure, and according to the contents disclosed in this specification, the scope and drawings of the present disclosure, any person skilled in the art can easily understand the purpose and advantages related to the present disclosure. The following examples further detail the view of the present disclosure, but do not limit the scope of the present disclosure in any way.

Figure 1:
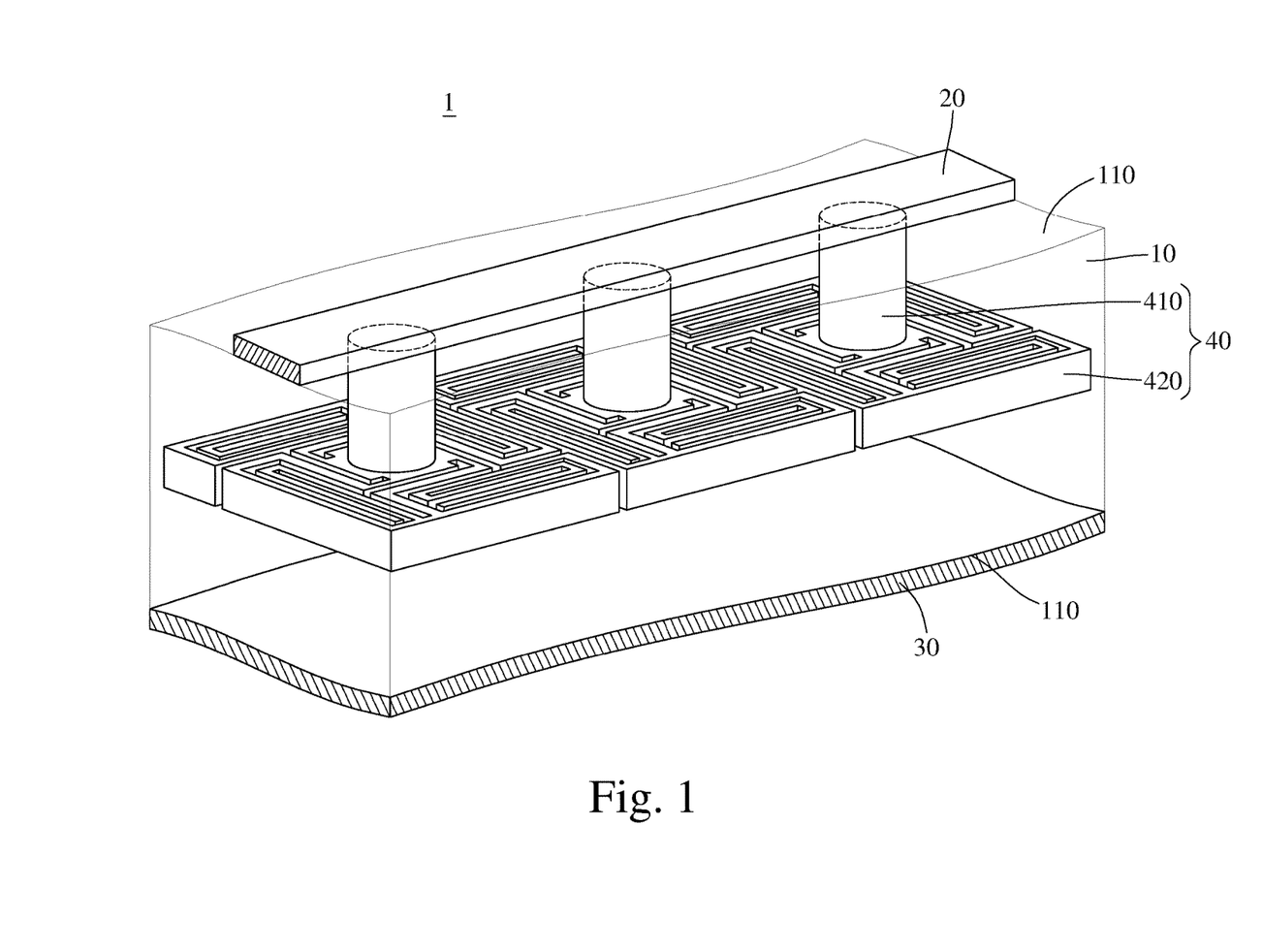
FIG. 1 is a partial perspective view of a circuit board according to a first embodiment of the present disclosure.
Figure 2:
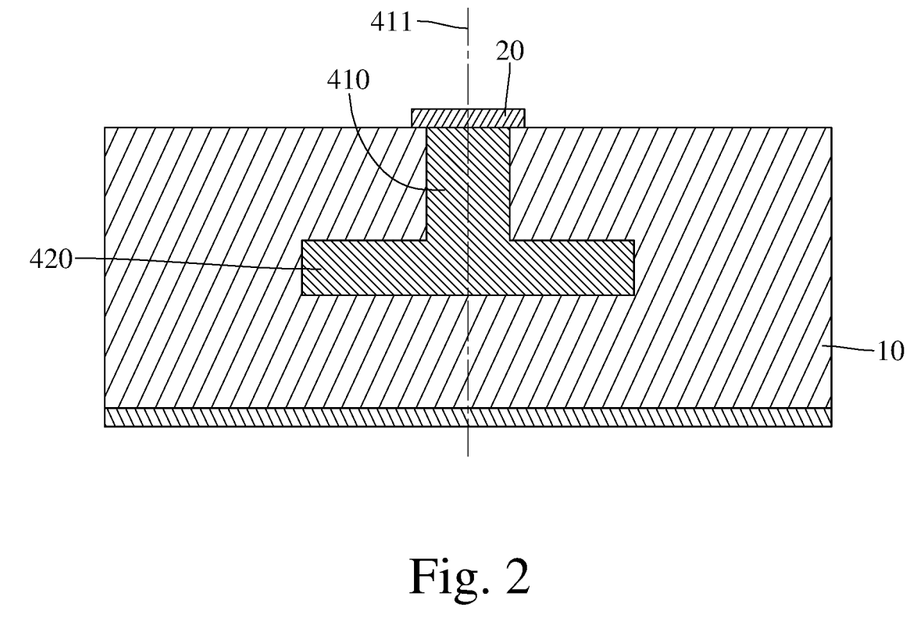
FIG. 2 is a cross-sectional view of the circuit board in FIG. 1.
Figure 3:
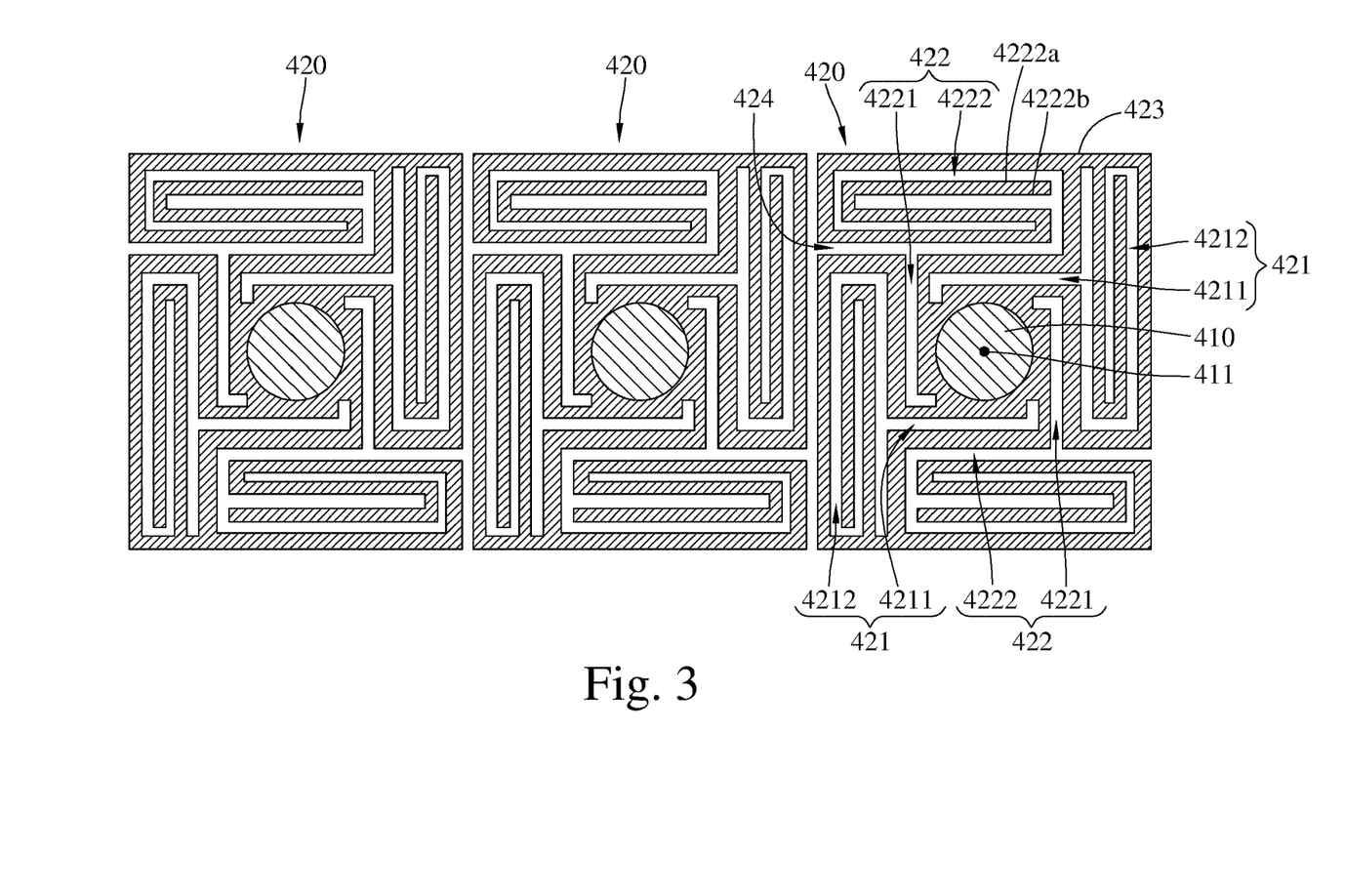
FIG. 3 is a top view of a signal suppression board of an electromagnetic bandgap structure of the circuit board in FIG. 1.

Please refer to FIG. 1 to FIG. 3. FIG. 1 is a partial perspective view of a circuit board according to a first embodiment of the present disclosure. FIG. 2 is a cross-sectional view of the circuit board in FIG. 1. FIG. 3 is a top view of a signal suppression board of an electromagnetic bandgap structure of the circuit board in FIG. 1. This embodiment provides a circuit board 1 including a dielectric layer 10, a conductive layer 20, a ground layer 30, and an electromagnetic bandgap structure 40.

The dielectric layer 10 is made of, for example, bakelite, fiberglass or plastic. The dielectric layer 10 has two opposing surfaces 110. The conductive layer 20 is disposed on one of the surfaces 110 of the dielectric layer 10. The conductive layer 20 is made of, for example, metal. The conductive layer 20 includes a plurality of microstrips taken as signal traces so as to control the impedance. The ground layer 30 is disposed on the other surface 110 of the dielectric layer 10. In such a configuration, the conductive layer 20 and the ground layer 30 are respectively located on two opposite sides of the dielectric layer 10.

The electromagnetic bandgap structure 40 is disposed in the dielectric layer 10 and located between the microstrips of the conductive layer 20 and the ground layer 30. The electromagnetic bandgap structure 40 includes a plurality of vias 410 and a plurality of signal suppression boards 420 in the same amount as the vias 410. However, the numbers of the vias 410 and the signal suppression board 420 are not restricted. Two opposite ends of the via 410 are electrically connected to the conductive layer 20 and the signal suppression board 420, respectively. In this embodiment, an inner surface of the via 410 is coated with a metal film, but the present disclosure is not limited thereto. In other embodiments, the via 410 may be a solid metal cylinder embedded in the dielectric layer 10.

The signal suppression board 420 is made of, for example, metal. The signal suppression board 420 has two first hollow patterns 421 and two second hollow patterns 422. These first hollow patterns 421 and second hollow patterns 422 penetrate through the signal suppression board 420. In this embodiment, the signal suppression boards 420 are the same, so only one of them is described in the following paragraphs.

As shown in FIG. 3, the first hollow patterns 421 and the second hollow patterns 422 are staggered around the via 410. In detail, the hollow patterns surrounding the via 410 according to the arrangement order are the first hollow pattern 421, the second hollow pattern 422, the first hollow pattern 421, and the second hollow pattern 422. The two first hollow patterns 421 are arranged point-symmetrically to a central axis 411 of the via 410. Similarly, the two second hollow patterns 422 are also arranged point-symmetrically to the central axis 411 of the via 410.

Each of the two first hollow patterns 421 has a first L-shaped channel 4211 and a square-shaped spiral channel 4212 connected to each other, and the two first L-shaped channels 4211 are respectively located at two opposite sides of the via 410. The square-shaped spiral channel 4212 is connected to the first L-shaped channel 4211. In this embodiment, the square-shaped spiral channel 4212 is connected to the long edge of the first L-shaped channel 4211, but the present disclosure is not limited thereto. In other embodiments, the square-shaped spiral channel 4212 may be connected to the short edge of the first L-shaped channel 4211. In addition, in this embodiment, the two first hollow patterns 421 are closed loops, meaning the first hollow pattern 421 is not connected to an outer surface 423 of the signal suppression board 420.

Each of the two second hollow patterns 422 has a second L-shaped channel 4221 and a comb-shaped channel 4222 connected to each other, and the two second L-shaped channels 4221 are respectively located at another two opposite sides of the via 410. Thus, the first L-shaped channels 4211 and the second L-shaped channels 4221 together surround the via 410. The comb-shaped channel 4222 is connected to the second L-shaped channel 4221, and the comb-shaped channel 4222 has a square-shaped spiral portion 4222a and a branch portion 4222b surrounded by square-shaped spiral portion 4222a. In this embodiment, the comb-shaped channel 4222 is connected to the long side of the second L-shaped channel 4221, but the present disclosure is not limited thereto. In other embodiments, the comb-shaped channel 4222 may be connected to the short side of the second L-shaped channel 4221. In addition, the two second hollow patterns 422 are open loops; in detail, each second hollow pattern 422 is connected to the outer surface 423 of the signal suppression board 420 through a notch 424.

By the electromagnetic bandgap structure 40 disposed in the dielectric layer 10, the S21 parameter (insertion loss, S (2,1)) of a specific frequency signal can be reduced so as to make the specific frequency signal within the conductive layer 20 incomplete. Further, the electromagnetic bandgap structure 40 can adjust the parasitic inductance and parasitic capacitance so that the overall bandwidth of the frequency to be blocked increases, and the resonant frequency is changed. The parasitic inductance can be increased by changing the position of the via 410 and forming a hollow pattern in specific structure on the signal suppression board 420. In addition, the parasitic capacitance can be adjusted by changing the hollow pattern and the size of the signal suppression board 420. The hollow patterns arranged point-symmetrically to the via 410 have signal resonance points between them, thereby blocking dual-band signals. As a result, the electromagnetic bandgap structure 40 helps to prevent noise emissions or noise from spreading along the power plane, thereby reducing self-interference.

Figure 4:
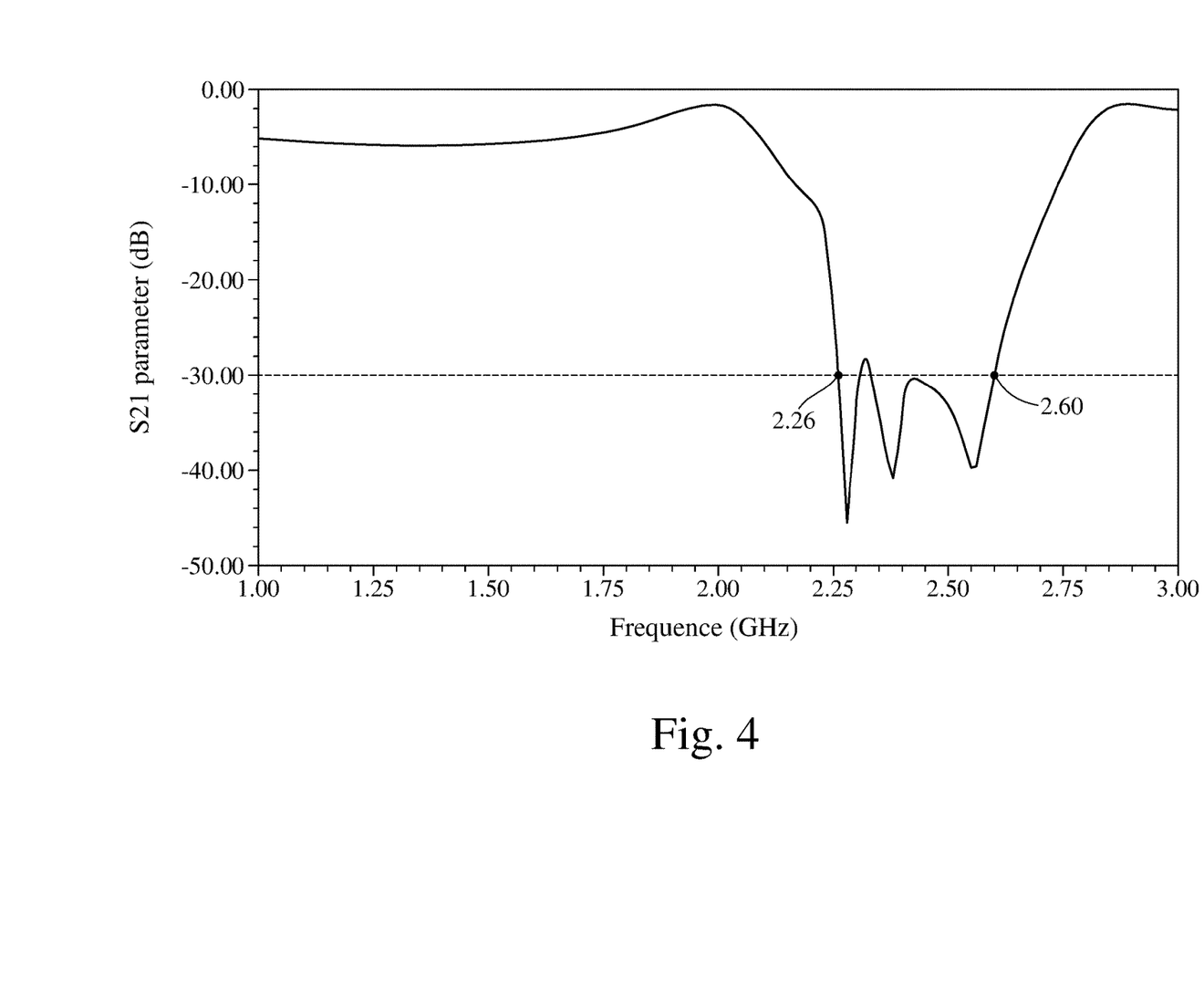
FIG. 4 is a diagram showing the relationship between S21 parameter in the first embodiment of the present disclosure and signal frequency.

FIG. 4 is a diagram showing the relationship between S21 parameter in the first embodiment of the present disclosure and signal frequency. When the electromagnetic bandgap structure 40 in FIG. 3 is disposed in the dielectric layer 10, the effect of blocking the dual-band signal can be achieved so that the S21 parameter of the signal in the microstrips of the conductive layer 20 ranging between 2.26 GHz and 2.60 GHz is smaller than −30 dB (decibels), while the S21 parameter of the signals in other bands remains at about −5 dB. This means that signals in the band ranging between 2.26 GHz and 2.60 GHz are blocked by the electromagnetic bandgap structure 40 and cannot be transmitted along the microstrips, while the signals in the other band are still able to be transmitted along the microstrips completely.

Figure 5:
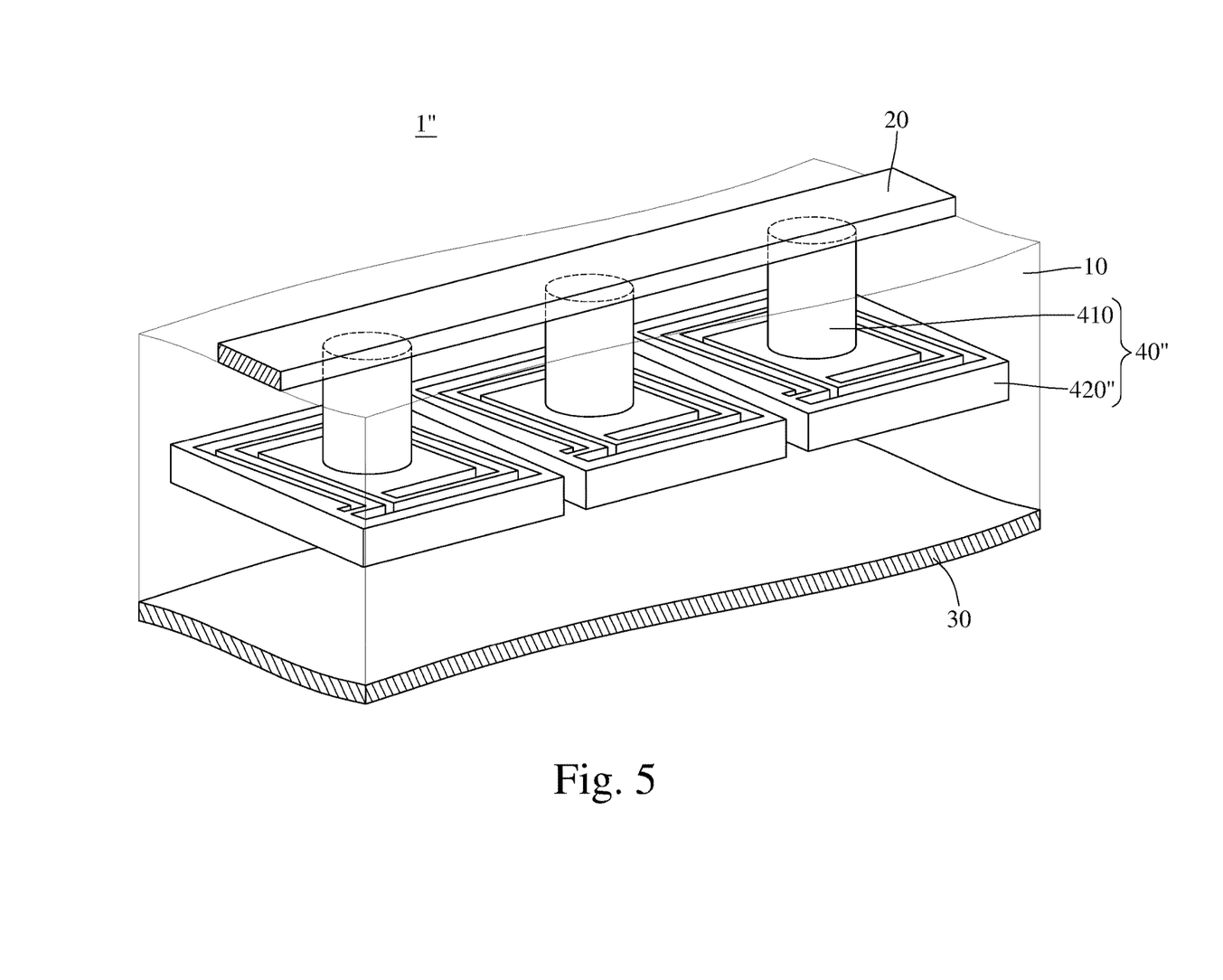
FIG. 5 is a partial perspective view of a circuit board according to a second embodiment of the present disclosure.
Figure 6:
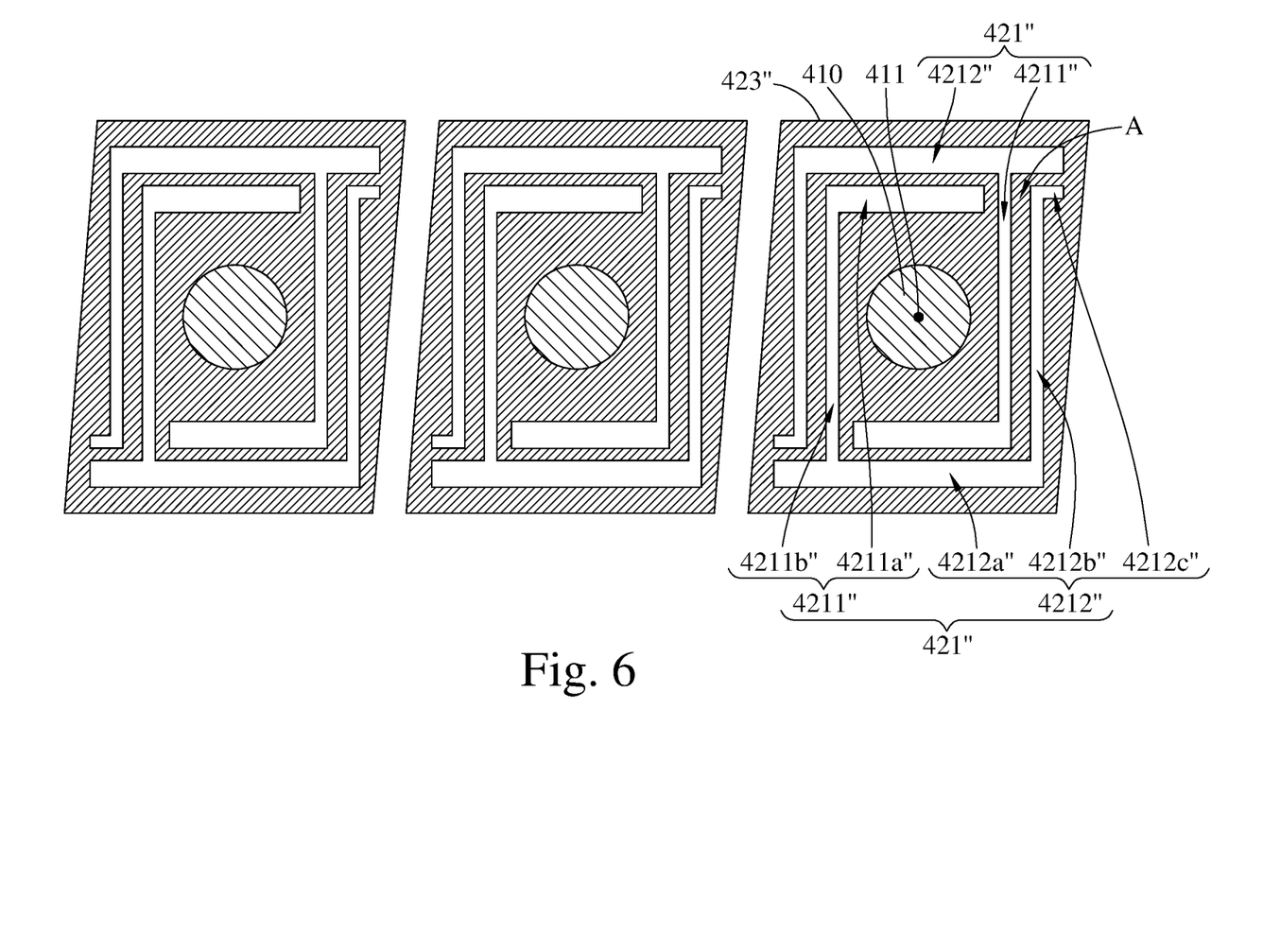
FIG. 6 is a top view of a signal suppression board of an electromagnetic bandgap structure of the circuit board in FIG. 5.

However, the signal suppression board is not restricted. Please refer to FIGS. 5-6, FIG. 5 is a partial perspective view of a circuit board according to a second embodiment of the present disclosure, and FIG. 6 is a top view of a signal suppression board of an electromagnetic bandgap structure of the circuit board in FIG. 5. This embodiment provides a circuit board 1" including a dielectric layer 10, a conductive layer 20, a ground layer 30, and an electromagnetic band structure 40" disposed in the dielectric layer 10. The dielectric layer 10, the conductive layer 20 and the ground layer 30 are similar to those in the first embodiment, and thus the description thereof will not be repeated in below.

The electromagnetic bandgap structure 40" includes a plurality of vias 410 and a plurality of signal suppression boards 420". The numbers of the vias 410 and the signal suppression boards 420" are not restricted. Two opposite ends of the via 410 are respectively electrically connected to the conductive layer 20 and the signal suppression board 420".

Each signal suppression board 420" has two hollow patterns 421", and each hollow pattern 421" penetrates through the signal suppression board 420". In this embodiment, the signal suppression boards 420 are the same, so only one of them is described in the following paragraphs.

As shown in FIG. 6, the two hollow patterns 421" are arranged point-symmetrically to the central axis 411 of the via 410. Each hollow pattern 421" has a first L-shaped channel 4211" and a second L-shaped channel 4212" that surround the via 410. The first L-shaped channel 4211" has a first extension portion 4211a" and a second extension portion 4211b" connected to each other, and the width of the first extension portion 4211a" is greater than the width of the second extension portion 4211b". The second L-shaped channel 4212" has a third extension portion 4212a", a forth extension portion 4212b" and a fifth extension portion 4212c" connected to each other, and the width of the third extension portion 4212a" is greater than the width of the forth extension portion 4212b". The first extension portion 4211a" and the third extension portion 4212a" are respectively located at two opposite sides of the via 410, and the second extension portion 4211b" and the forth extension portion 4212b" are respectively located at another two opposite sides of the via 410. The second extension portion 4211b" of the first L-shaped channel 4211" is connected to the third extension portion 4212a" of the second L-shaped channel 4212", and an end of the first extension portion 4211a" away from the second extension portion 4211b" is spaced apart from the forth extension portion 4212b" so that there is an area A between the first extension portion 4211a" and the forth extension portion 4212b". One of the first L-Shaped channels 4211" of the hollow pattern 421" passes through the area A and is surrounded by another hollow pattern 421". The fifth extension portion 4212c" of the second L-shaped channel 4212" is connected to an end of the forth extension portion 4212b" away from the third extension portion 4212a", and the fifth extension portion 4212c" extends from the forth extension portion 4212b" in a direction away from the via 410.

In addition, the contour of an outer surface 423" of each signal suppression board 420 is a parallelogram, and the two hollow patterns 421" of each signal suppression board 420" are closed loops. Further, in this embodiment, the hollow pattern 421" is not connected to the outer surface 423", and the contour of the outer surface 423" is not a square or a rectangular.

Figure 7:
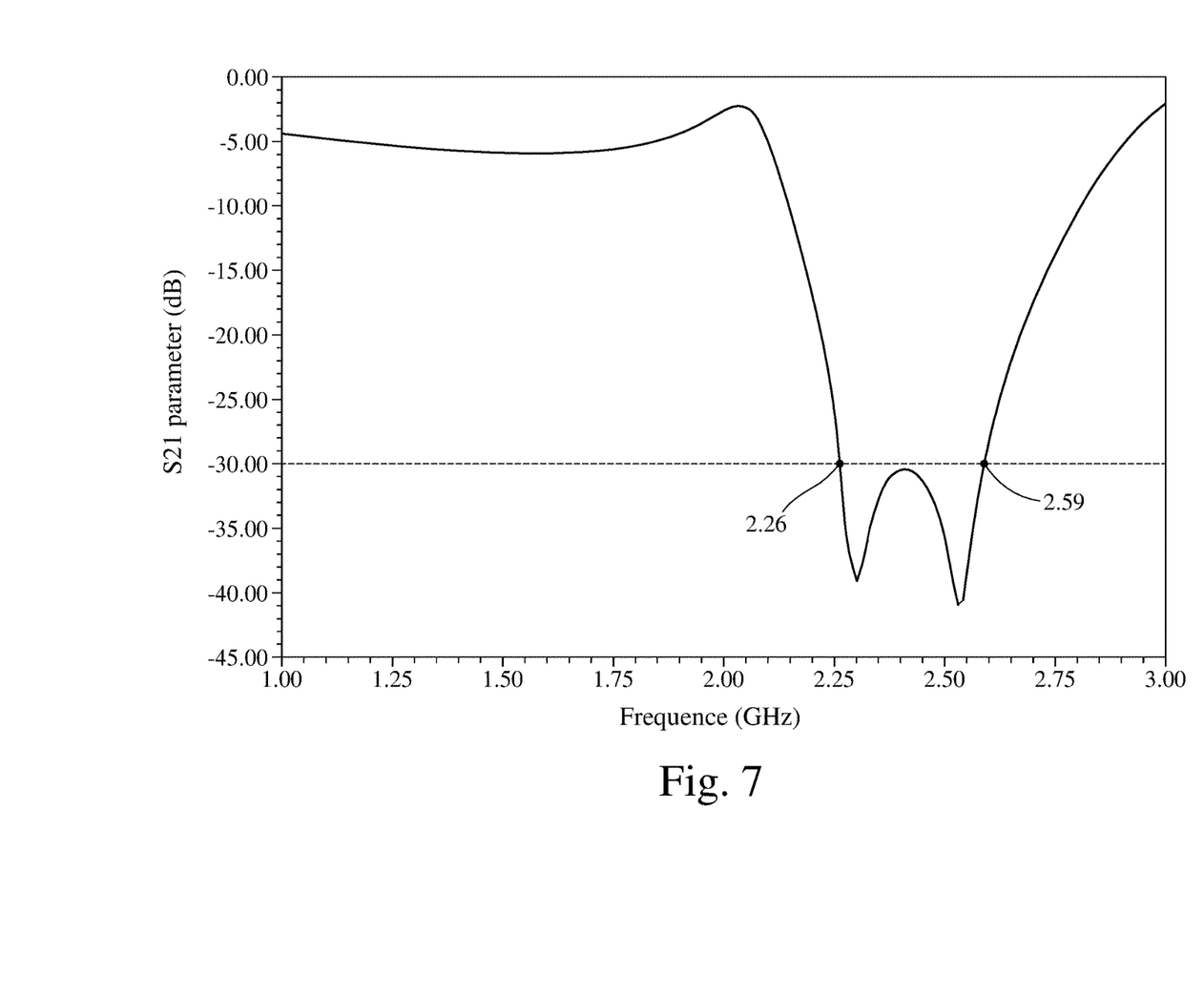
FIG. 7 is a diagram showing the relationship between S21 parameter in the second embodiment of the present disclosure and signal frequency.

By the electromagnetic bandgap structure 40", the S21 parameter of the specific frequency signal can be reduced to block the transmission integrity of the specific frequency signal in the conductive layer 20. FIG. 7 is a diagram showing the relationship between S21 parameter in the second embodiment of the present disclosure and signal frequency. When the electromagnetic bandgap structure 40 of FIG. 6 is disposed in the dielectric layer 10, the effect of blocking the dual-band signal can be achieved, so that the S21 parameter of the signal of the conductive layer 20 in the band ranging between 2.26 GHz and 2.59 GHz is smaller than −30 dB, while the S21 parameters of the signals in other bands remains at about −5 dB. This means that the signals in the band between 2.26 GHz and 2.59 GHz are blocked by the electromagnetic bandgap structure 40 and cannot be further transmitted along the conductive layer 20, while most of the signals in the other band are transmitted completely along the conductive layer 20.

According to the circuit board and the electromagnetic bandgap structure as discussed in above, the dielectric layer of the circuit board is able to be electrically connected to the conductive layer through the electromagnetic bandgap structure having the hollow patterns, and the hollow patterns are able to block the transmission of dual-band signal, thus self-interference is reduced, thereby preventing noise emissions and noise from spreading.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A circuit board, comprising:
   a dielectric layer;
   a conductive layer disposed on a surface of the dielectric layer; and
   an electromagnetic bandgap structure disposed inside the dielectric layer, the electromagnetic bandgap structure comprising a via and a signal suppression board, two opposite ends of the via respectively connected to the conductive layer and the signal suppression board, and the signal suppression board having at least one hollow pattern;
   wherein each of the at least one hollow pattern of the signal suppression board has a first L-shaped channel and a second L-shaped channel surrounding the via, the first L-shaped channel has a first wide extension portion and a first narrow extension portion connected to each other, the second L-shaped channel has a second wide extension portion and a second narrow extension portion connected to each other, the first wide extension portion and the second wide extension portion are respectively located at two opposite sides of the via, the first narrow extension portion and the second narrow extension portion are respectively located at another two opposite sides of the via, the first narrow extension portion is connected to the second wide extension portion, and an end of the first wide extension portion away from the first narrow extension portion is separated apart from the second narrow extension portion.

2. The circuit board according to claim 1, wherein the second L-shaped channel further comprises an extension portion connected to an end of the second narrow extension portion away from the second wide extension portion and extends from the second narrow extension portion in a direction away from the via.

3. The circuit board according to claim 1, wherein a number of the at least one of the hollow pattern is two, and the two hollow patterns are arranged point-symmetrically to the via.

4. The circuit board according to claim 1, wherein a number of the at least one of the hollow pattern is two, and the two hollow patterns are arranged point-symmetrically to the via.

5. The circuit board according to claim 1, wherein the contour of an outer surface of the signal suppression board is a parallelogram, and the at least one of the hollow pattern is a closed loop.

6. The circuit board according to claim 1, wherein the at least one of the hollow pattern comprises two first hollow patterns arranged point-symmetrically to the via, each of the two first hollow patterns has a first L-shaped channel and a square-shaped spiral channel connected to each other, and the first L-shaped channels are respectively located at two opposite sides of the via.

7. The circuit board according to claim 6, wherein the at least one hollow pattern further comprises two second hollow patterns arranged point-symmetrically to the via, each of the two second hollow patterns has a second L-shaped channel and a comb-shaped channel connected to each other, the two second L-shaped channels are respectively located at another two opposite sides of the via, and the two first hollow patterns and the two second hollow patterns are staggered around the via.

8. The circuit board according to claim 7, wherein the two first hollow patterns are closed loops, and the second two hollow patterns are open loops.

9. An electromagnetic bandgap structure, comprising:

a via; and a signal suppression board connected to the via, and the signal suppression board having two first hollow patterns and two second hollow patterns, the two first hollow patterns arranged point-symmetrically to the via, the two second hollow patterns arranged point-symmetrically to the via, and the two first hollow patterns and the two second hollow patterns being staggered around the via;

wherein each of the two first hollow patterns has a first L-shaped channel and a square-shaped spiral channel connected to each other, the two first L-shaped channels are respectively located at two opposite sides of the via, each of the two second hollow patterns has a second L-shaped channel and a comb-shaped channel connected to each other, the two second L-shaped channels are respectively located at another two opposite sides of the via.

* * * * *